(12) United States Patent
Kanazawa

(10) Patent No.: US 8,206,198 B2
(45) Date of Patent: Jun. 26, 2012

(54) WAFER GRINDING MACHINE AND WAFER GRINDING METHOD

(75) Inventor: Masaki Kanazawa, Tokyo (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 789 days.

(21) Appl. No.: 12/337,546

(22) Filed: Dec. 17, 2008

(65) Prior Publication Data
US 2009/0163120 A1   Jun. 25, 2009

(30) Foreign Application Priority Data
Dec. 21, 2007   (JP) ................................ 2007-330254

(51) Int. Cl.
    B24B 1/00   (2006.01)
(52) U.S. Cl. ............................. 451/54; 451/57
(58) Field of Classification Search .................. 451/287, 451/288, 289, 54, 73, 57, 398, 388
    See application file for complete search history.

(56) References Cited

U.S. PATENT DOCUMENTS

| 5,931,725 | A | 8/1999 | Inaba et al. | |
| 6,652,357 | B1 * | 11/2003 | Williams | 451/8 |
| 7,654,888 | B2 * | 2/2010 | Zuniga et al. | 451/398 |
| 2003/0232580 | A1 | 12/2003 | Mashino | |
| 2007/0287363 | A1 | 12/2007 | Lange | |

FOREIGN PATENT DOCUMENTS

| EP | 0 751 553 B1 | 3/2003 |
| EP | 0 981 156 B1 | 7/2004 |
| JP | 56-033835 | 4/1981 |
| JP | 5-206091 | 8/1993 |
| JP | 10-94959 | 4/1998 |
| JP | 10-156679 | 6/1998 |
| JP | 2000-21952 | 1/2000 |
| JP | 2006-135113 | 5/2006 |

OTHER PUBLICATIONS

Singapore Search Report dated May 4, 2009, for corresponding Singapore application 200808907-0, noting listed references in this IDS.
Machine translation of JP 5-206091, dated Aug. 13, 1993, listed above.

(Continued)

Primary Examiner — Robert Rose
(74) Attorney, Agent, or Firm — Christie, Parker & Hale, LLP.

(57) ABSTRACT

A wafer grinding machine and a wafer grinding method are disclosed. A barrier (60) is arranged around a holding unit (29) to hold at least a wafer (40) with a film (11) attached on the front surface (41) thereof and with the back surface (42) thereof directed upward. The upper surface (61) of the barrier unit is ground to the position between the back surface of the wafer held by the holding unit and the boundary between the wafer and the film. Then, the wafer is ground while being held with the back surface thereof up by the holding unit. As a result, the film is prevented from coming off from the wafer at the time of grinding the back surface of the wafer. Further, when the wafer is ground, a fluid may be supplied into the gap between the barrier unit and the outer peripheral portion of the wafer held by the holding unit.

2 Claims, 5 Drawing Sheets

OTHER PUBLICATIONS

Machine translation of JP 2006-135113, dated, May 25, 2006, listed above.
Patent Abstracts of Japan, Publication No. 2000-021952, Published on Jan. 21, 2000, in the name of Ishikawa et al.
Office action dated Sep. 17, 2010 for corresponding Korean Patent Application No. 10-2008-0131515 including translation, 7pp.
Office action dated Nov. 11, 2009 cited in corresponding German Patent Application No. 102008063716.5.

* cited by examiner

WAFER GRINDING MACHINE AND WAFER GRINDING METHOD

CROSS-REFERENCE TO RELATED APPLICATION

This application claims priority of Japanese Patent Application Number 2007-330254, filed on Dec. 21, 2007.

BACKGROUND OF THE INVENTION

1. Field of the Invention

This invention relates to a wafer grinding method for grinding the back surface of a wafer held by suction and a wafer grinding machine for carrying out the grinding method.

2. Description of the Related Art

In the field of semiconductor manufacturing, wafers tend to become larger year by year and the wafers are made thinner in order to increase packing density. In order to make a semiconductor wafer thinner, a backgrinding process for grinding a back surface of the wafer is performed. Japanese Unexamined Patent Publication No. 2000-21952, for example, discloses a technique for grinding the back surface of the wafer by holding the wafer by adsorption in a chuck using the sucking force of the vacuum.

FIG. 5 is a schematic diagram showing the wafer grinding machine according to the prior art as disclosed in Japanese Unexamined Patent Publication No. 2000-21952. At the time of grinding the back surface of the wafer, a surface protection film 11 is attached on the front surface 41 of the wafer 40. This surface protection film 11 protects the circuit patterns (not shown) formed on the front surface 41. As shown in FIG. 5, the wafer 40 is held by adsorption to an adsorption unit 260 with the back surface 42 directed up.

As indicated by solid arrows in FIG. 5, the grinding fluid is supplied to the contact point between a grinding stone 280 and the wafer 40, which are rotated with each other.

The greater part of the grinding fluid is supplied to the back surface 42 of the wafer 40. However, as shown in FIG. 5, part of the grinding fluid impinges directly on the boundary 45 between the front surface 41 and the front surface protection film 11 of the wafer 40. As a result, as shown in the partial sectional view of FIG. 6 showing the conventional wafer grinding machine, the surface protection film 11 is separated from the edge of the wafer 40.

In such a case, the grinding fluid flows into the gap between the wafer 40 and the surface protection film 11 and may foul the circuit pattern on the front surface 41 of the wafer 40. When the grinding fluid flows further into the gap, the surface protection film 11 is further separated. As a result, the wafer 40 may come off from the adsorption unit 260 with the front surface protection film 11 held by the adsorption unit 260.

This invention has been achieved in view of this situation, and the object thereof is to provide a wafer grinding method capable of preventing the surface protection film from being separated from the wafer at the time of grinding the back surface of the wafer and a wafer grinding machine for carrying out the method.

SUMMARY OF THE INVENTION

In order to achieve the object described above, according to a first aspect of the invention, there is provided a wafer grinding machine including a holding means for holding a wafer with a film attached on the front surface thereof and with the back surface thereof directed upward, a grinding means for grinding the back surface of the wafer held by the holding means and a barrier unit arranged around the holding means.

Specifically, in the first aspect, the grinding fluid impinges on the back surface of the wafer or the barrier unit, and therefore, is prevented from being supplied directly to the boundary between the wafer and the film. Therefore, at the time of grinding the back surface of the wafer, the separation of the film from the film by the grinding fluid is avoided.

According to a second aspect of the invention, there is provided a wafer grinding machine as in the first aspect, wherein the top surface of the barrier unit is located between the front surface of the wafer and the back surface of the wafer held by the holding means.

Specifically, in the second aspect, the grinding means can grind the back surface of the wafer without coming into contact with the top surface of the barrier unit.

According to a third aspect of the invention, there is provided a wafer grinding machine as in the second aspect, wherein the top surface of the barrier unit comes to be located between the back surface of the wafer and the front surface of the wafer by being ground by the grinding means.

Specifically, in the third aspect, the height of the top surface of the barrier unit can be easily and simply adjusted even in the case where the back surface of the wafer is ground in a different amount.

According to a fourth aspect of the invention, there is provided a wafer grinding machine as in any one of the first to third aspects, further including a fluid supply means for supplying a fluid into the gap between the barrier unit and the outer peripheral portion of the wafer held by the holding means at the time of grinding the wafer in the grinding means.

Specifically, in the fourth aspect, the chips and dust deposited in the gap between the barrier unit and the outer peripheral portion of the wafer can be washed off.

According to a fifth aspect of the invention, there is provided a wafer grinding method comprising the steps of arranging a barrier unit around a holding means adapted to hold a wafer with a film attached on the front surface thereof and with the back surface thereof directed upward, grinding the upper surface of the barrier unit to the height between the front surface of the wafer and the back surface of the wafer held by the holding means, holding the wafer with the back surface thereof directed upward by the holding means, and grinding the back surface of the wafer.

Specifically, in the fifth aspect, the grinding fluid impinges on the back surface of the wafer or the barrier unit, and therefore, the grinding fluid is prevented from being supplied directly to the boundary between the wafer and the film. Therefore, at the time of grinding the back surface of the wafer, the separation of the film from the wafer by the grinding fluid is avoided.

According to a sixth aspect of the invention, there is provided a wafer grinding method as in the fifth aspect, wherein the step of grinding the wafer further includes the step of supplying a fluid into the gap between the barrier unit and the outer peripheral portion of the wafer held by the holding means.

Specifically, in the sixth aspect, the chips and dust deposited in the gap between the barrier unit and the outer peripheral portion of the wafer can be washed off.

These and other objects, features and advantages will be made more apparent by the detailed description of typical embodiments of the invention taken in conjunction with the accompanying drawings.

BRIEF DESCRIPTION OF THE DRAWINGS

FIG. 2b is a side sectional view of the table shown in FIG. 2a.

DETAILED DESCRIPTION OF THE PREFERRED EMBODIMENTS

Figure 1:
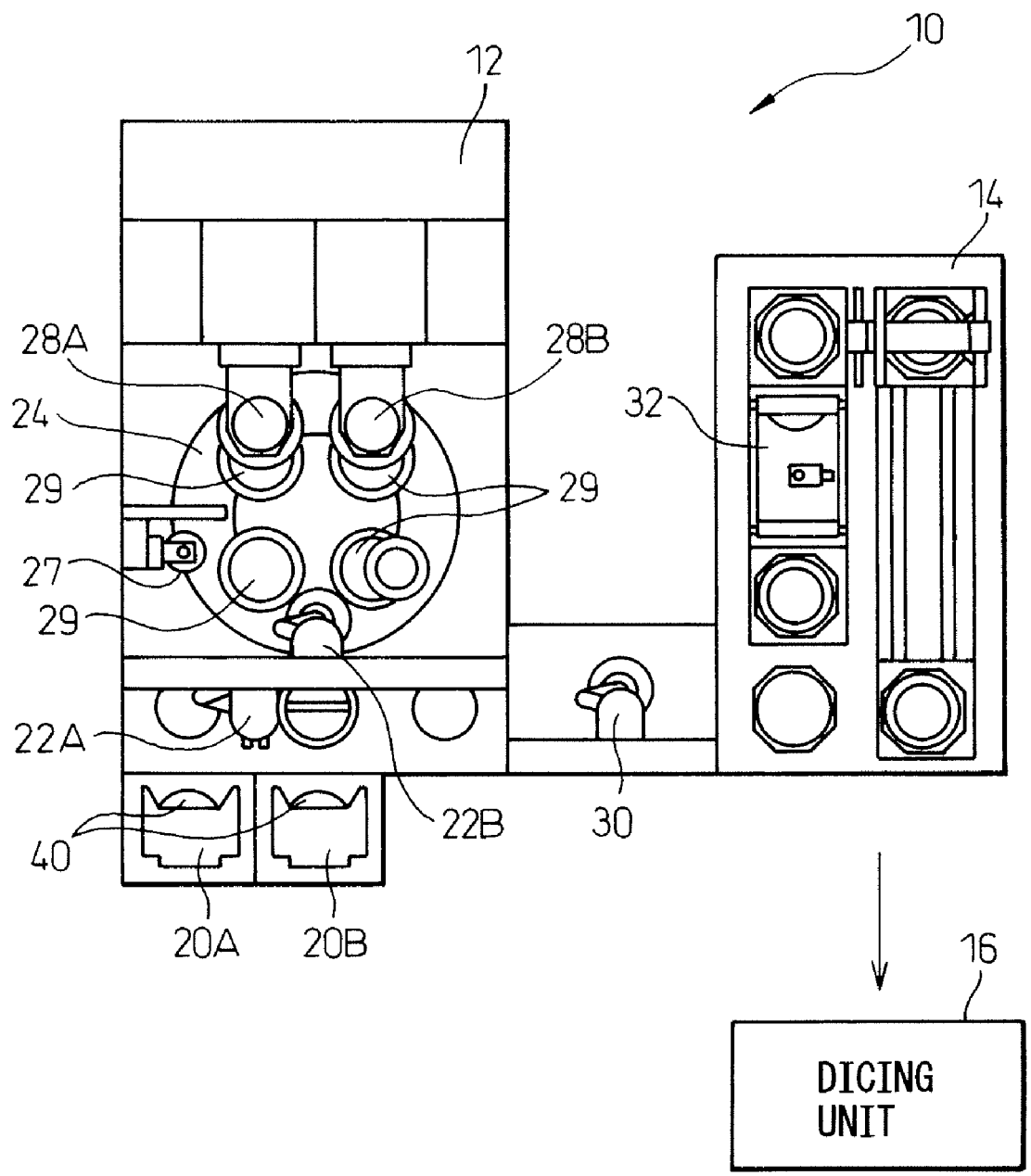
FIG. 1 is a plan view schematically showing a wafer processing apparatus to which the invention is applicable.

The embodiments of the invention are explained below with reference to the accompanying drawings. In the drawings, similar members are designated by the same reference numerals, respectively. To facilitate understanding, the scale of each of these drawings has been appropriately changed.

FIG. 1 is a plan view schematically showing a wafer processing apparatus to which the invention is applicable. A wafer processing apparatus 10 mainly includes a back surface grinding unit 12 for grinding the back surface of the wafer and a dicing tape attaching unit 14 for attaching the dicing tape on the wafer. These units are controlled by a control unit not shown. The wafer processed by the dicing tape attaching unit 14 is transported to a dicing unit 16 and diced.

The back surface grinding unit 12 has wafer cassettes 20A, 20B for accommodating plural wafers 40. The wafers 40 are retrieved one by one from the wafer cassettes 20A, 20B by robot arms 22A, 22B. Then, the wafers 40 are held by adsorption on tables 29 of a rotary stage 24 with the back surface thereof up. Incidentally, the front surface of each wafer 40 is already formed with plural circuit patterns (not shown), and has attached thereon a surface protection film 11 for protecting the circuit patterns.

Then, the grinding units 28A, 28B of the back surface grinding unit 12 are driven to grind the back surface of each wafer 40. The grinding units 28A, 28B, like the grinding stone 280 described above, have a grinding fluid source for supplying the grinding fluid in the direction tangential to the grinding units 28A, 28B. By grinding the back surface, the thickness of each wafer 40 is reduced to the desired value or, for example, 50 micrometers.

Upon completion of the back grinding of the wafer 40, the wafer 40 is transported by the robot arm 30 from the back surface grinding unit 12 to the dicing tape attaching unit 14, and the dicing tape 32 is attached on the back surface of each wafer 40 by a well-known method. Then, the surface protection film attached on the front surface of the wafers 40 is separated by a well-known method, after that each wafer 40 is transported to the dicing unit 16 and diced to a predetermined size.

Figure 2A:
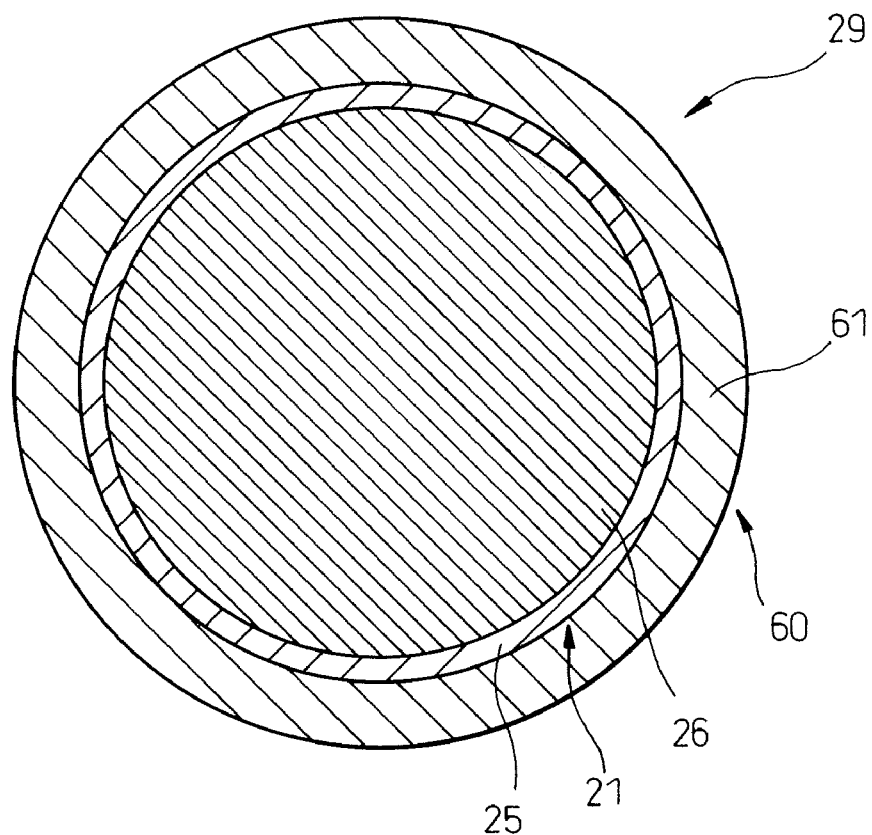
FIG. 2a is a top plan view of the table of the wafer grinding machine according to this invention.
Figure 2B:
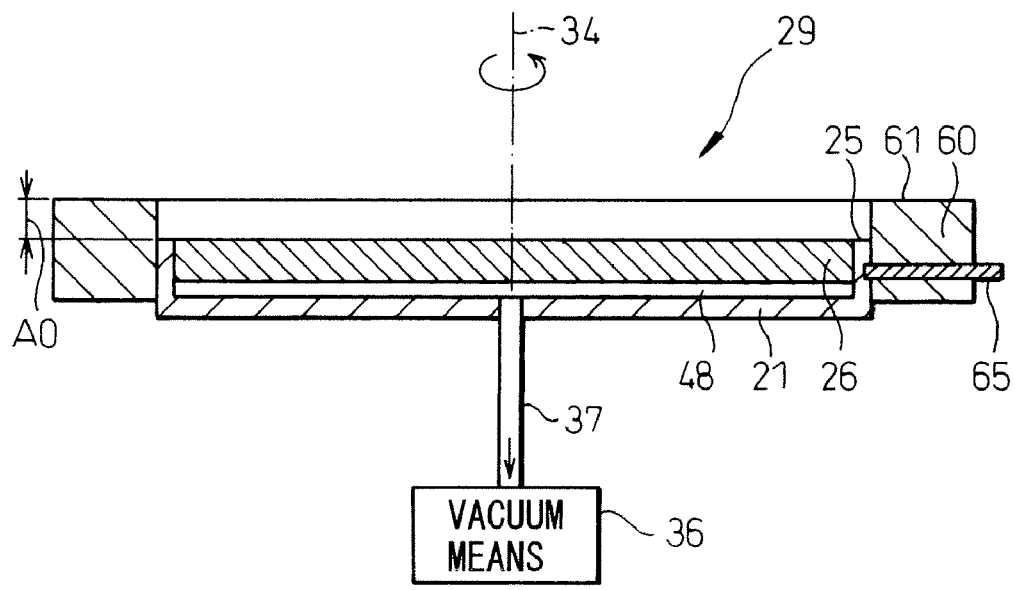

FIG. 2a is a top plan view of one table 29 arranged on the rotary stage 24 of the back surface grinding unit 12, and FIG. 2b a side sectional view of the table shown in FIG. 2a. The table 29 is mainly configured of a cup-shaped base 21 and an adsorption unit 26 buried in the upper surface of the base 21.

As can be seen from FIG. 2b, the upper surface of the adsorption unit 26 is flush with the upper surface 25 of the outer peripheral portion of the base 21. The outer diameter of the base 21 is larger than the diameter of the wafer, and the outer diameter of the adsorption unit 26 is smaller than the diameter of the wafer. Incidentally, as shown, each table 29 is adapted to be rotated around a rotary axis 34.

The adsorption unit 26 is formed of, for example, porous alumina, and the base 21 is formed of, for example, dense alumina. As shown, a vacuum means 36 such as a vacuum pump is connected to the internal space 48 of the base 21 through a tube path 37. The lower surface of the adsorption unit 26 is exposed to the internal space 48. Therefore, when the vacuum means 36 is driven, the suction force acts on the upper surface of the adsorption unit 26.

As can be seen from FIGS. 2a and 2b, according to this invention, a barrier unit 60 is arranged around the base 21. The barrier unit 60 is formed of a substantially annular member having substantially the same inner diameter as the outer diameter of the base 21. Also, the barrier unit 60 is formed of the same material as, for example, the base 21. As an alternative, the base 21 may be formed of another material adapted to be ground by the grinding units 28A, 28B.

As shown in FIG. 2b, the barrier unit 60 is fixed by inserting a fixing means 65 into the hole of the barrier unit 60 and the depression formed on the outer peripheral surface of the base 21. In the process, the upper surface 61 of the barrier unit 60 is located a predetermined distance A0 above the upper surface of the adsorption unit 26.

The operation of the back surface grinding unit 12 according to the invention is explained with reference to the side sectional views of FIGS. 3a to 3d. To simplify the explanation, the vacuum means 36 and the fixing means 65 are not shown in FIGS. 3a to 3d.

Figure 3A:
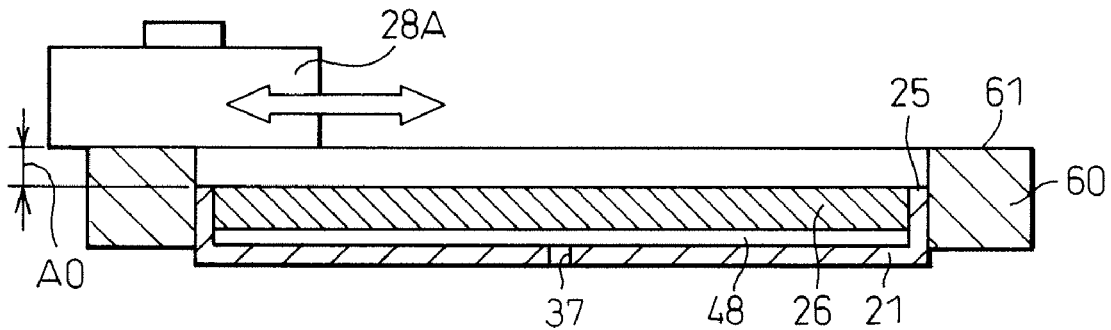
FIG. 3a is a first side sectional view of the wafer grinding machine according to the invention.
Figure 3B:
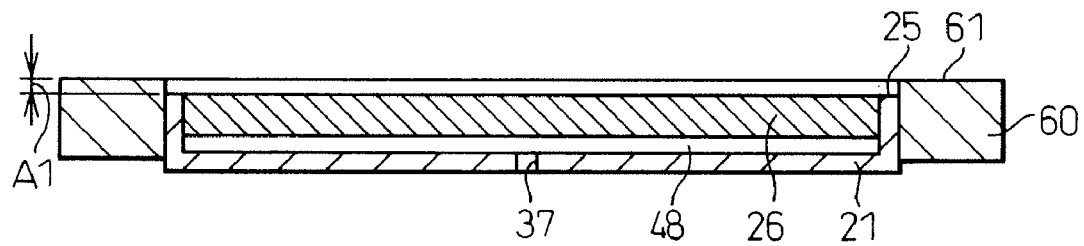
FIG. 3b is a second side sectional view of the wafer grinding machine according to the invention.

First, as shown in FIG. 3a, the upper surface 61 of the barrier unit 60 is ground using the grinding unit 28A. In the process, wafer 40 is not adsorbed to the adsorption unit 26, and therefore, the vacuum means 36 is not started. The grinding operation on the upper surface 61 of the barrier unit 60 is performed until the distance from the upper surface of the adsorption unit 26 to the upper surface 61 of the barrier unit 60 reaches a predetermined length A1 (A1: positive value) (see FIG. 3b).

Figure 3C:
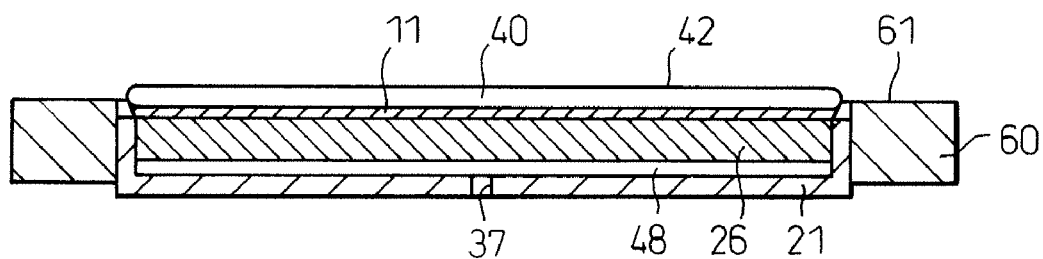
FIG. 3c is a third side sectional view of the wafer grinding machine according to the invention.

Then, the table 29 is cleaned with a cleaning unit 27 (see FIG. 1), so that the chips generated by the grinding of the barrier unit 60 are discharged from the tables 29, or especially, from the adsorption unit 26. After that, as shown in FIG. 3c, wafer 40 is arranged on the adsorption unit 26 of the tables 29 with the back surface 42 of the wafer 40 up. Then, the vacuum means 36 is activated to hold the wafers 40 to the adsorption unit 26 by adsorption. The subsequent processes are executed with the wafers 40 held by adsorption.

As can be seen from FIG. 3c, when the wafer 40 is held by adsorption to the adsorption unit 26, the back surface 42 (upper surface) of wafer 40 is located above the upper surface 61 of the barrier unit 60. On the contrary, the front surface 41 of the wafer 40, is adjacent to the adsorption unit 26. In view of the fact that the surface protection film 11 is attached on the front surface 41 of the wafer 40, however, the circuit pattern (not shown) formed on the front surface 41 of the wafer 40 never come into direct contact with the adsorption unit 26.

Figure 3D:
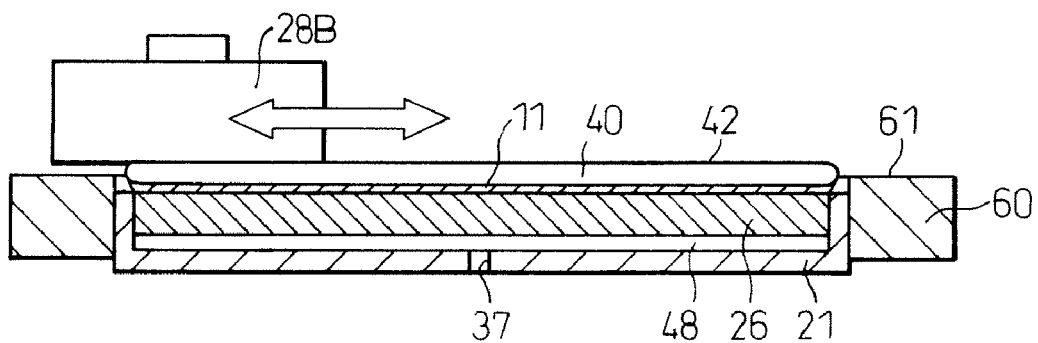
FIG. 3d is a fourth side sectional view of the wafer grinding machine according to the invention.
Figure 4:
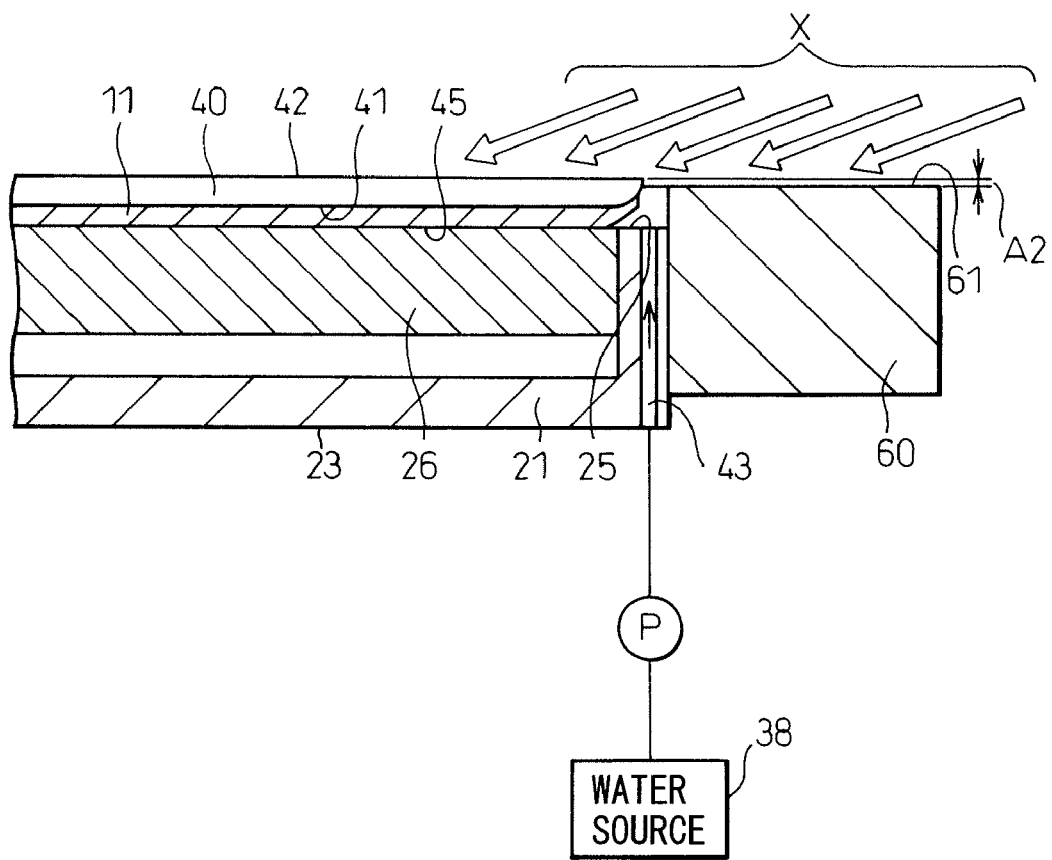
FIG. 4 is a partial sectional view of the wafer grinding machine according to the invention.

Then, as shown in FIG. 3d, the back surface 42 of each wafer 40 is ground by the grinding unit 28B. Incidentally, the grinding unit 28A may be reused to grind the back surface 42 of the wafers 40. As can be seen from the partial sectional view of FIG. 4 showing the wafer grinding machine, the grind operation is continued until the distance between the back surface 42 of wafer 40 and the upper surface 61 of the barrier unit 60 reaches a predetermined length A2. Once the distance between the wafers 40 and the barrier unit 60 reaches the predetermined length A2, the grind operation of the back surface 42 of the wafers 40 is finished.

The predetermined distance A2 is so small that the grinding unit 28B is not brought into contact with the upper surface 61 of the barrier unit 60. By subtracting the predetermined distance A2 from the total value of the thickness of the wafer 40 after back grind and the thickness of the surface protection film 11, the distance A1 (FIG. 3b) between the upper surface 61 of the barrier unit 60 and the adsorption unit 26 after grinding the barrier unit 60 can be obtained. The thickness of the wafer 40 after back grind is predetermined by the specification, and so is the thickness of the surface protection film 11. In other words, the value of the distance A1 is varied with the grinding amount of the wafer 40. According to this invention, since the upper surface 61 of the barrier unit 60 is ground, the height of the top surface 61 of the barrier unit 60 can be easily and simply adjusted even in the case where the back surface grinding amount of the wafer 40 is different.

Figure 5:
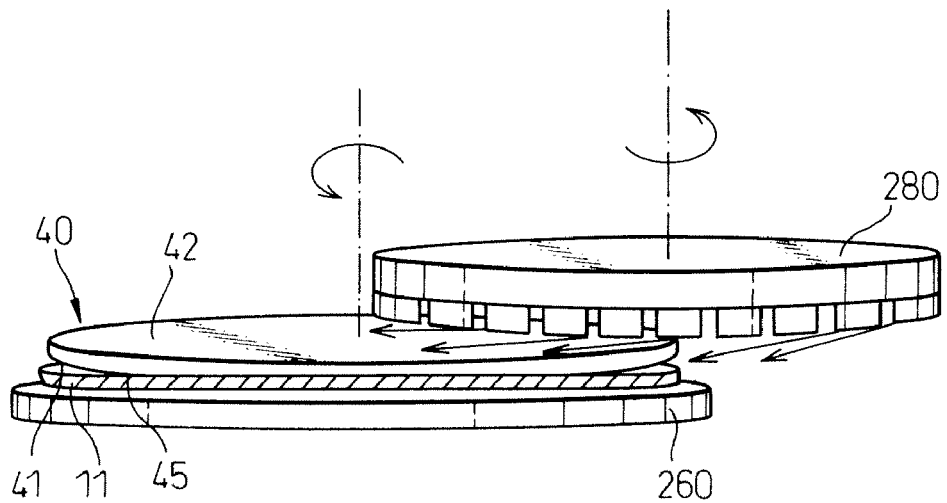
FIG. 5 is a schematic diagram showing the wafer grinding machine according to the prior art.
Figure 6:
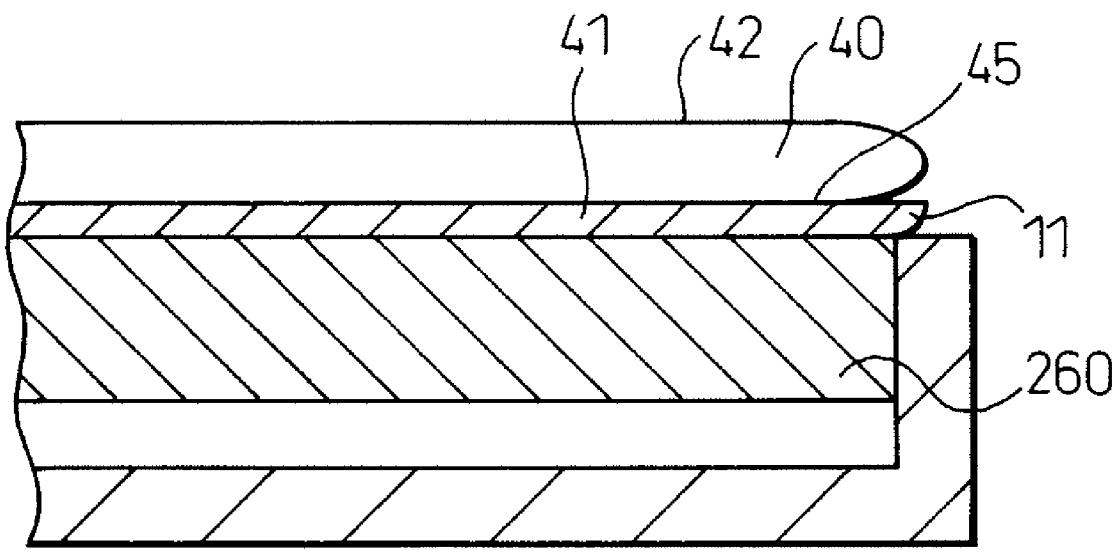
FIG. 6 is a partial sectional view of the wafer grinding machine according to the prior art.

As described above, at the time of grinding the back surface shown in FIG. 3d, the grinding fluid from the grinding fluid source of the grinding unit 28B is supplied toward the wafers 40 (see FIG. 5). According to this invention, the barrier unit 60 is arranged around the tables 29. Therefore, as indicated by arrows X in FIG. 4, the grinding fluid impinges on the back surface 42 of the wafers 40 or the upper surface 61 of the barrier unit 60. Specifically, according to this invention, the grinding fluid is not supplied directly to the boundary between wafer 40 and the surface protection film 11. Therefore, at the time of grinding the back surface of the wafers 40, the surface protection film 11 is prevented from being separated from the wafer 40 by the grinding fluid.

Thus, according to this invention, the grinding fluid never flows in between the wafer 40 and the surface protection film 11, and therefore, the circuit patterns (not shown) on the front surface 41 are prevented from being fouled. Furthermore, since the surface protection film 11 is not separated, the wafer 40 never come off from the adsorption unit 26. As a result, the risk of the wafers 40 being damaged can be avoided.

In FIG. 4, paths 43 extend from the upper surface 25 of the outer peripheral portion to the lower surface 23 of the base 21. The paths 43 are formed equidistantly on the upper surface 25 of the outer peripheral portion along the peripheral direction of the base 21. As shown, the paths 43 are connected to a water source 38 such as a water tank through a pump P.

According to this invention, the barrier unit 60 is arranged around the table 29, and therefore, an annular gap is formed between the edge of each wafer 40, the inner peripheral surface of the barrier unit 60 and the upper surface 25 of the outer peripheral portion of the base 21. In the case where the back surface 42 of the wafer 40 is ground with the existence of this annular gap, the chips of the wafer 40 are deposited in the annular gap.

In such a case, the pump P is driven and the water from the water source 38 is supplied to the upper surface 25 of the outer peripheral portion. As a result, the chips in the annular gap are washed out of the barrier unit 60 by the water, and thus prevented from being deposited in the annular gap. Incidentally, the water is supplied at a sufficiently small rate, and therefore, the water supplied into the annular gap from the upper surface 25 of the outer peripheral portion fails to directly reach the boundary 45 between the wafer 40 and the surface protection film 11. As a result, the surface protection film 11 is not separated by the water supplied from the water source 38. Incidentally, a path (not shown) extending from the lower surface of the barrier unit 60 to the inner peripheral surface of the barrier unit 60 may be formed to wash away the chips. Such a case is also apparently included in the scope of the invention.

Although the invention has been explained above with reference to typical embodiments thereof, it will be understood to those skilled in the art that the invention can be variously modified, omitted or added without departing from the scope thereof.

The invention claimed is:

1. A wafer grinding method comprising the steps of:
    arranging a barrier unit around a holding means adapted to hold a wafer with a film attached on a front surface thereof, wherein a back surface of the wafer is directed upward;
    grinding an upper surface of the barrier unit to a height between the front surface of the wafer and the back surface of the wafer held by the holding means;
    holding the wafer with the back surface thereof directed upward by the holding means; and
    grinding the back surface of the wafer.

2. The wafer grinding method according to claim 1, wherein the step of grinding the wafer includes the step of supplying a fluid into a gap between the barrier unit and an outer peripheral portion of the wafer held by the holding means.

* * * * *